(12) United States Patent
Laufenberg et al.

(10) Patent No.: US 11,177,062 B2
(45) Date of Patent: Nov. 16, 2021

(54) ACTUATOR SYSTEM AND USE OF AN ACTUATOR SYSTEM

(71) Applicant: ETO MAGNETIC GmbH, Stockach (DE)

(72) Inventors: Markus Laufenberg, Stockach (DE); Thomas Schiepp, Seitingen-Oberflacht (DE)

(73) Assignee: ETO MAGNETIC GmbH, Stockach (DE)

( * ) Notice: Subject to any disclaimer, the term of this patent is extended or adjusted under 35 U.S.C. 154(b) by 464 days.

(21) Appl. No.: 16/307,637

(22) PCT Filed: May 31, 2017

(86) PCT No.: PCT/EP2017/063154
§ 371 (c)(1),
(2) Date: Apr. 4, 2019

(87) PCT Pub. No.: WO2017/211643
PCT Pub. Date: Dec. 14, 2017

(65) Prior Publication Data
US 2019/0304651 A1    Oct. 3, 2019

(30) Foreign Application Priority Data
Jun. 9, 2016    (DE) .................. 10 2016 110 669.0

(51) Int. Cl.
*H01F 7/122*    (2006.01)
*H01F 1/03*    (2006.01)
(Continued)

(52) U.S. Cl.
CPC .......... *H01F 7/122* (2013.01); *H01F 1/0308* (2013.01); *H01F 7/124* (2013.01); *H01F 7/1646* (2013.01); *H01L 41/12* (2013.01); *H02N 2/02* (2013.01)

(58) Field of Classification Search
CPC ........ H01F 7/122; H01F 1/0308; H01F 7/124; H01F 7/1646; H01L 41/12; H02N 2/02; H02N 2/10; F04B 19/006; F04B 17/03
See application file for complete search history.

(56) References Cited

U.S. PATENT DOCUMENTS 6,515,382 B1    2/2003    Ullakko
9,091,251 B1    7/2015    Ullakko et al.
(Continued)

FOREIGN PATENT DOCUMENTS

DE    10 2009 014 304 A1    10/2010
DE    10 2013 221 744 A1    4/2015
DE    102016107460 A1 *    10/2017    ........... F16K 31/082

OTHER PUBLICATIONS

Search Report dated Apr. 12, 2017 issued in corresponding DE patent application No. 10 2016 110 669.0 (and partial English translation).

(Continued)

*Primary Examiner* — Mohamad A Musleh
(74) *Attorney, Agent, or Firm* — Posz Law Group, PLC (57) ABSTRACT

An actuator device has at least one actuator element which at least in part is composed of a magnetically shape-shiftable material, and has a magnet unit which comprises at least one first magnetic element that is implemented as a coil unit and at least one second magnetic element that is implemented as a permanent magnet,
at least the first magnetic element and the second magnetic element are configured for interacting in at least one operating state so as to cause a local deformation of the actuator element in a partial region of the actuator element.

19 Claims, 5 Drawing Sheets

(51) Int. Cl.
*H01F 7/124* (2006.01)
*H01F 7/16* (2006.01)
*H01L 41/12* (2006.01)
*H02N 2/02* (2006.01)

(56) References Cited

U.S. PATENT DOCUMENTS

| | | | | |
|---|---|---|---|---|
| 9,847,160 B2* | 12/2017 | Schiepp | ............... | H01F 7/08 |
| 10,424,717 B2* | 9/2019 | Schiepp | ............... | H01L 41/06 |
| 2004/0206922 A1* | 10/2004 | Du Plessis | ......... | F16K 31/0613 |
| | | | | 251/129.06 |
| 2005/0018015 A1* | 1/2005 | Silverbrook | ............ | G06K 7/14 |
| | | | | 347/54 |
| 2006/0044093 A1* | 3/2006 | Ohta | .................. | H02K 99/20 |
| | | | | 335/220 |
| 2006/0144472 A1* | 7/2006 | Ullakko | ............... | H01L 41/12 |
| | | | | 148/104 |
| 2009/0033448 A1* | 2/2009 | Hoang | ............... | F02M 51/0603 |
| | | | | 335/215 |
| 2010/0242673 A1 | 9/2010 | Laufenberg | | |
| 2014/0091646 A1* | 4/2014 | Schiepp | ............... | H01L 41/12 |
| | | | | 310/26 |
| 2015/0118077 A1 | 4/2015 | Humburg | | |
| 2015/0207059 A1* | 7/2015 | Laufenberg | ............. | H01L 41/06 |
| | | | | 310/26 |
| 2016/0087553 A1* | 3/2016 | Mullner | ................. | F04B 17/03 |
| | | | | 417/423.7 |
| 2016/0148736 A1* | 5/2016 | Schiepp | ................. | H01L 41/12 |
| | | | | 335/268 |
| 2016/0301293 A1* | 10/2016 | Mullner | ................. | H01L 41/12 |
| 2019/0109546 A1* | 4/2019 | Blank | ................... | A61C 17/34 |
| 2020/0111633 A1* | 4/2020 | Schautzgy | ........... | H01H 37/323 |

OTHER PUBLICATIONS

International Search Report dated Aug. 28, 2017 issued in corresponding International Patent Application No. PCT/EP2017/063154 (English translation only).
International Preliminary Report on Patentability dated Dec. 11, 2018 issued in corresponding International Patent Application No. PCT/EP2017/063154 (English translation only).
European Search Report dated Jan. 22, 2020 in the corresponding EP application No. 17 726 946.1 (with English translation).

* cited by examiner

ACTUATOR SYSTEM AND USE OF AN ACTUATOR SYSTEM

CROSS REFERENCE TO RELATED APPLICATIONS

This application is a U.S. national stage application of PCT/EP2017/063154 filed on May 31, 2017, which is based on German Patent Application No. 10 2016 110 669.0 filed on Jun. 9, 2016, the contents of which are incorporated herein by reference.

PRIOR ART

The invention proceeds from an actuator device according to the preamble of claim 1, and from a method with an actuator device according to the preamble of claim 21.

An actuator device which has an actuator element from a magnetic shape-memory alloy material (also known as MSM material) and a magnetic unit for influencing the actuator element, wherein the magnetic unit is composed exclusively of coils, is known from US 2016/0087553 A1.

An actuator device wherein an actuator element that is composed of a magnetic shape-memory alloy material is capable of being influenced by means of rotatably mounted permanent magnets is furthermore known from U.S. Pat. No. 9,091,251 B1.

Moreover, a fluid pump which has a pump body from a magnetic shape-memory alloy material and a magnetic unit for influencing the pump body, wherein the magnetic unit is composed exclusively of coils, is known from DE 10 2013 221 744 A1.

The object of the invention lies in particular in providing an actuator device of the generic type having improved properties in terms of efficiency. The object is achieved by the characterizing features of patent claims 1 and 21, while advantageous design embodiments and refinements of the invention can be derived from the dependent claims.

Advantages of the Invention

The invention proceeds from an actuator device having at least one actuator element which at least in part, preferably at least to a large part, and particularly preferably completely, is composed of a magnetically shape-shiftable material, and having a magnetic unit which comprises at least one first magnetic element that is implemented as a coil unit and at least one second magnetic element that is implemented as a permanent magnet.

It is proposed that at least the first magnetic element and the second magnetic element are configured for interacting in at least one operating state so as to cause a local deformation of the actuator element in a partial region, advantageously in a peripheral region, of the actuator element. "Configured" is in particular to be understood to be specially programmed, conceived and/or equipped. That an object is configured for a specific function is in particular to be understood that the object fulfils and/or carries out this specific function in at least one application state and/or operating state. The term "at least to a large part" herein is in particular to be understood to be at least 55%, advantageously at least 65%, preferably at least 75%, particularly preferably at least 85%, and particularly advantageously at least 95%.

An "actuator device" in this context is in particular to be understood to be at least one part, in particular a functional sub-group, of an actuator. The actuator device is advantageously configured at least for use in a fluid pump, in particular a micro pump, for example for use in the automotive sector and/or the medical sector, and/or in a positioning system, in particular an optical positioning system, in particular for positioning optical construction elements such as, for example, mirrors, lenses, and/or other optical systems. The actuator device herein can in particular also comprise an actuator housing that is advantageously implemented as an external housing, in particular at least for receiving the actuator element and/or the magnetic unit. An "actuator element" is in particular to be understood to be an element which is in particular configured for converting an external stimulus such as, for example, an electrical signal, a thermal signal, a mechanical signal, and/or advantageously at least one magnetic signal, to a movement. The actuator element herein is in particular at least in part implemented so as to be shape-shiftable and is in particular configured for altering a shape depending on the external stimulus. A volume of the actuator element herein is preferably constant. The actuator element is particularly advantageously embodied in a one-part implementation. "Embodied in a one-part implementation" is in particular to mean, in this context, at least connected by substance-to-substance bond and/or implemented together. A substance-to-substance bond can be produced, for example, by an adhesive-bonding process, an additive injection-molding process, a welding process, a soldering process, and/or another process. However, "embodied in a one-part implementation" is advantageously to mean shaped from one piece and/or in one piece. Furthermore, a "magnetically shape-shiftable material" is in particular to be understood as a material which is capable of being influenced by means of an in particular external magnetic field, and in at least one operating state is advantageously configured for altering a shape at least depending on the magnetic field.

Furthermore, a "magnetic unit" is in particular to be understood to be a unit which is configured for in at least one operating state providing and/or generating a magnetic field which acts in particular on the actuator element, and on account thereof for influencing in particular a deformation of the actuator element. That one object "influences" another object in this context is in particular to be understood that the further object in the absence and/or inactivity of the object has and/or assumes another state, another shape, and/or another position than in the presence and/or activity of the object. The magnetic unit is advantageously configured to provide a magnetic field which is aligned so as to be perpendicular to a longitudinal extent of the actuator element. The magnetic unit, in particular by means of the magnetic field, is particularly preferably configured for causing a shape alteration of the actuator element in at least one application state. Moreover, the magnetic unit is advantageously arranged at least in part in a proximity of the actuator element. A "proximity" is in particular to be understood to be a spatial region which is formed from points which are remote from a reference point and/or a reference component, in particular from the actuator element, by less than one third, preferably less than one quarter, more preferably less than one sixth, and particularly preferably less than one tenth of a minimum longitudinal extent of the actuator element, and/or which in each case have a spacing of at most 20 mm, preferably of at most 10 mm, and particularly preferably of at most 5 mm from a reference point and/or a reference component, in particular the actuator element. Furthermore, a "longitudinal extent" of an in particular elongate object is in particular to be understood to be a maximum extent of the object. The longitudinal extent of the object herein defines in particular a direction of longitudinal extent of the object. A magnetic element that is implemented as a "coil unit" is in particular to be understood to be a magnetic element having at least one coil and/or a circuit of a plurality of coils. Moreover, a magnetic element, in particular a magnetic element that is implemented as a permanent magnet, is in particular at least in part, preferably at least to a large part, and particularly preferably completely, composed from a permanently magnetic material. In this context, a "permanently magnetic material" is in particular to be understood to be a magnetic material which, in particular after initial magnetizing, has a residual magnetism. The permanently magnetic material herein advantageously has a residual magnetism flux density of at least 0.2 T, in particular of at least 0.4 T, and in particular of at least 0.6 T.

That "two magnetic elements are configured for interacting" is in particular to be understood that the magnetic elements generate and/or provide in each case an individual magnetic field which are in particular superimposed in such a manner that an in particular resulting and/or common magnetic field, advantageously in a region of the actuator element, is altered, in particular reduced and/or increased, in particular by at least 10%, advantageously by at least 30%, and particularly advantageously by at least 50%, in particular as compared to the individual magnetic fields, wherein in particular the, in particular resulting and/or common, magnetic field causes a deformation of the actuator element. Moreover, a "local deformation of the actuator element in a partial region of the actuator element" is in particular to be understood to be an in particular purely local deformation of the actuator element, said deformation being arranged completely in the partial region of the actuator element. The partial region herein in particular has a length of extent that corresponds to at most 85%, advantageously at most 65%, preferably at most 45%, and particularly preferably at most 25% to a length of extent of the actuator element that corresponds to the length of extent of the partial region and/or is arranged at least substantially parallel thereto. In particular, the actuator element herein is not deformed in partial region that is different from the partial region. The partial region is particularly preferably a partial region of a longitudinal side of the actuator element which extends in particular in a direction of longitudinal extent of the actuator element, wherein the local deformation is in particular completely arranged in the longitudinal side of the actuator element. The local deformation furthermore advantageously has a length of extent, advantageously a longitudinal extent, which is arranged at least substantially parallel with the direction of longitudinal extent of the actuator element and which corresponds to at most 85%, advantageously to at most 65%, preferably to at most 45%, and particularly preferably to at most 25% of the longitudinal extent of the actuator element. The local deformation, at least when viewed perpendicularly to the direction of longitudinal extent of the actuator element, preferably has an at least substantially semi-elliptic contour. The local deformation herein could be implemented as a local elevation, for example. However, the local deformation is advantageously implemented as a local depression and/or trough. In this context, "at least substantially parallel" is in particular to be understood to be an alignment of a direction relative to a reference direction, in particular in a plane, wherein the direction in relation to the reference direction has a deviation in particular of less than 8°, advantageously less than 5°, and particularly advantageously less than 2°. Furthermore, "an at least substantially semi-elliptic" object is in particular to be understood to be an object which deviates from a semi-elliptic reference object by way of a proportion of area of at most 20%, preferably of at most 15%, and particularly preferably of at most 10%. On account of this implementation, an actuator device having improved properties in terms of efficiency, in particular energy efficiency, component efficiency, installation space efficiency, and/or cost efficiency, can be made available. Moreover, a generation of heat as is the case, for example, in the exclusive use of electromagnets, can advantageously be reduced. Moreover, a particularly compact actuator device can advantageously be provided. Moreover, an actuation, in particular of the magnetic unit, can advantageously be simplified. Furthermore, an advantageously noise-minimized actuator device can be made available.

At least the first magnetic element and the second magnetic element are preferably configured for interacting in at least one further operating state so as to cause an in particular purely local deformation of the actuator element in a further partial region, advantageously a further peripheral region, of the actuator element that at least in part and preferably completely is different from the partial region. The further peripheral region of the actuator element advantageously lies opposite the peripheral region of the actuator element, in particular in relation to the longitudinal extent of the actuator element. The further operating state here in could in particular be identical to the operating state. However, the further operating state is preferably different from the operating state. The partial region of the actuator element in the further operating state is preferably not deformed and/or free of any local deformation. On account thereof, a simultaneous and/or alternating activation of a plurality of objects and/or an advantageous pump effect can in particular be achieved.

When at least the first magnetic element and the second magnetic element are configured for generating an in particular common variable magnetic field so as to cause a movement of the local deformation from the partial region to the further partial region, a particularly simple pump movement can in particular be achieved. At least the first magnetic element and the second magnetic element are preferably configured for generating an at least substantially uniform movement. The terminology "at least substantially uniform" herein is in particular to be understood as uniform in the context of a setting accuracy and/or in the context of technical possibilities.

The magnetically shape-shiftable material could correspond to a magnetostrictive material, for example. However, the magnetically shape-shiftable material is advantageously a magnetically effective and/or active shape-memory material, in particular a magnetic shape-memory material, and particularly preferably a magnetic shape-memory alloy (also known as MSM material). The magnetically shape-shiftable material herein preferably contains nickel, manganese, and gallium. On account thereof, a particularly simple deformation can in particular be implemented by way of an advantageously large actuation length.

The actuator element could be implemented, for example, as a hollow body such as, for example, a hollow cylinder. However, the actuator element is preferably implemented as a solid body and has in particular an at least substantially cylindrical, in particular circular-cylindrical, and/or advantageously an at least substantially stripe-shaped, in particular cuboid, shape and/or contour. An "at least substantially cylindrical" object in this context is in particular to be understood to be an object which deviates from a cylindrical reference object by way of a volumetric proportion of at most 20%, preferably of at most 15%, and particularly preferably of at most 10%. The same is to apply in analogous manner in particular to the terminology at least substantially stripe-shaped. An advantageously cost-efficient actuator element can in particular be provided on account thereof.

It is furthermore proposed that the first magnetic element and the second magnetic element are arranged on opposite sides of the actuator element. The first magnetic element and the second magnetic element herein are advantageously arranged on opposite longitudinal sides of the actuator element which extend in particular in the direction of longitudinal extent of the actuator element. On account thereof a local deformation of the actuator element can be achieved in a particularly advantageous manner.

It is furthermore proposed that the first magnetic element has a coil axis which is aligned so as to be at least substantially perpendicular to a direction of longitudinal extent of the actuator element. In this context, the term "at least substantially perpendicular" is in particular to define an alignment of a direction relative to a reference direction, wherein the direction and the reference direction, in particular when viewed in a plane, enclose an angle in particular between 82° and 98°, advantageously between 85° and 95°, and particularly preferably between 88° and 92°. A number of required coil units can in particular be reduced on account thereof.

In one preferred design embodiment of the invention it is proposed that the second magnetic element is implemented as a rare-earth magnet. The second magnetic element herein is advantageously composed at least in part, preferably at least to a large part, and particularly preferably completely, of neodymium/iron/boron, a neodymium/iron/boron alloy, samarium/cobalt, and/or a samarium/cobalt alloy. An advantageously strong magnetic field can in particular be generated on account thereof.

When the second magnetic element is arranged spaced apart from the actuator element, a magnetic field generated by the magnetic elements can set in an advantageously simple manner.

The second magnetic element herein is advantageously arranged in a proximity of the actuator element.

The second magnetic element could be movable relative to the actuator element, for example. However, an advantageously simple construction can in particular be achieved when the second magnetic element is immobile relative to the actuator element. The second magnetic element herein is in particular implemented so as to be stationary. Moreover, the first magnetic element is preferably immobile relative to the actuator element. The in particular entire magnetic unit is particularly advantageously immobile relative to the actuator element.

In one particularly preferred design embodiment of the invention it is proposed that the second magnetic element has a magnetizing direction which is aligned so as to be at least substantially parallel with a direction of longitudinal extent of the actuator element. Moreover, the second magnetic element advantageously has a longitudinal extent which is aligned so as to be at least substantially parallel with the direction of longitudinal extent of the actuator element. An advantageously compact actuator device can in particular be provided on account thereof.

Alternatively, it is proposed that the second magnetic element has a magnetizing direction which is aligned so as to be at least substantially perpendicular to a direction of longitudinal extent of the actuator element. The second magnetic element in this case moreover advantageously has a longitudinal extent which is aligned so as to be at least substantially perpendicular to the direction of longitudinal extent of the actuator element. On account thereof, the actuator device can advantageously be adapted to in particular external conditions and/or requirements.

In one further design embodiment of the invention it is proposed that the magnetic unit has at least one third magnetic element which is configured for interacting with the first magnetic element and/or the second magnetic element so as to cause a local deformation of the actuator element, advantageously in the partial region and/or the further partial region of the actuator element. On account thereof, an output of the first magnetic element and/or of the second magnetic element can in particular be reduced, on account of which costs can advantageously be lowered and/or an output efficiency can be improved.

The third magnetic element could be implemented as a further coil unit, for example. However, in one preferred design embodiment of the invention it is proposed that the third magnetic element is implemented as a permanent magnet. The third magnetic element is preferably implemented as a rare-earth magnet and is advantageously composed at least in part, preferably at least to a large part, and particularly preferably completely, from neodymium/iron/boron, a neodymium/iron/boron alloy, samarium/cobalt, and/or a samarium/cobalt alloy. The third magnetic element is preferably immobile relative to the actuator element. Moreover, the first magnetic element and the third magnetic element are advantageously arranged on opposite sides, advantageously longitudinal sides, of the actuator element. The third magnetic element herein is advantageously arranged in a proximity of the actuator element particularly advantageously so as to be spaced apart from the actuator element. Moreover, the third magnetic element could have a magnetizing direction and/or a longitudinal extent which are/is aligned so as to be at least substantially perpendicular to the direction of longitudinal extent of the actuator element. However, the third magnetic element advantageously has a magnetizing direction which is aligned so as to be at least substantially parallel with the direction of longitudinal extent of the actuator element. Moreover, the third magnetic element preferably has a longitudinal extent which is aligned so as to be at least substantially parallel with the direction of longitudinal extent of the actuator element. On account thereof, an installation space efficiency can in particular be optimized.

It is furthermore advantageously proposed that the third magnetic element is at least substantially identical to the second magnetic element. The terminology "at least substantially identical" herein is to be understood in particular identical apart from production tolerances and/or in the context of production-technological possibilities and/or in the context of standardized tolerances. Costs can in particular be reduced on account thereof.

A design embodiment that is almost neutral in terms of installation space can in particular be achieved when the second magnetic element and the third magnetic element are arranged on a same side, in particular longitudinal side, of the actuator element.

It is moreover proposed that the magnetic unit has at least one flux direction means which at least substantially completely encompasses at least the actuator element and advantageously the first magnetic element, the second magnetic element and/or the third magnetic element. The flux direction means herein, conjointly with the second magnetic element and/or the third magnetic element preferably generates a magnetic circuit. The flux direction means is furthermore advantageously implemented at least in part, preferably at least to a large part, and particularly preferably completely, as a ferrite element, in particular an iron element. The terminology "at least substantially completely" herein is to be in particular understood to be to at least 85%, advantageously to at least 90%, preferably to at least 90%, and particularly preferably to at least 95%. On account thereof, in particular an advantageous guidance of the magnetic field and in particular an advantageously exact positioning and/or setting of the local deformation can in particular be achieved.

It is furthermore proposed that the magnetic unit has at least one flux concentrator, which is configured for increasing a magnetic field, in particular of the magnetic elements, that acts on the actuator element. The flux concentrator herein is advantageously assigned to one of the magnetic elements and in particular in an assembled state is arranged at least in part between the magnetic element assigned to the flux concentrator and the actuator element. On account thereof, a magnetic field that acts on the actuator element can in particular be increased, on account of which a number of magnetic elements and/or a size of the magnetic elements can advantageously be reduced. An actuator device that is advantageously efficient in terms of installation space can thus be in particular provided.

In one particularly preferred design embodiment of the invention it is proposed that the magnetic unit comprises at most two magnetic elements that are implemented as coil units. The magnetic unit preferably comprises exactly one magnetic element, in particular the first magnetic element, that is implemented as a coil unit. On account thereof, a heat generation can in particular be particularly advantageously minimized.

The invention moreover proceeds from a method with an actuator device, wherein the actuator device has at least one actuator element which at least in part, preferably at least to a large part, and particularly preferably completely, is composed of a magnetically shape-shiftable material and has a magnetic unit which comprises at least one first magnetic element that is implemented as a coil unit and at least one second magnetic element that is implemented as a permanent magnet. It is proposed the actuator element is locally deformed in a partial region, advantageously a peripheral region, at least by means of the interaction of the first magnetic element and of the second magnetic element. On account thereof, an efficiency, in particular an energy efficiency, a component efficiency, an installation space efficiency, and/or a cost efficiency can in particular be improved. Moreover, a heat generation such as is the case, for example, in the exclusive use of electromagnets, can advantageously be reduced. Moreover, a particularly compact actuator device can advantageously be provided. Moreover, an actuation in particular of the magnetic unit can be advantageously simplified. Furthermore, an advantageously noise-minimized actuator device can be provided.

The actuator device and the method with the actuator device herein are not to be limited to the application and embodiment described above. In particular, the actuator device and the method with the actuator device for fulfilling a functional mode described herein can have a number of individual elements, components, and units that deviates from the number mentioned herein.

DRAWINGS

Further advantages are derived from the following description of the drawings. Exemplary embodiments of the invention are illustrated in the drawings. The drawings, the description, and the claims include numerous features in combination. A person skilled in the art will expediently also consider the features individually and combine said features to meaningful further combinations.

In the drawings.

DESCRIPTION OF THE EXEMPLARY EMBODIMENTS

Figure 1A:
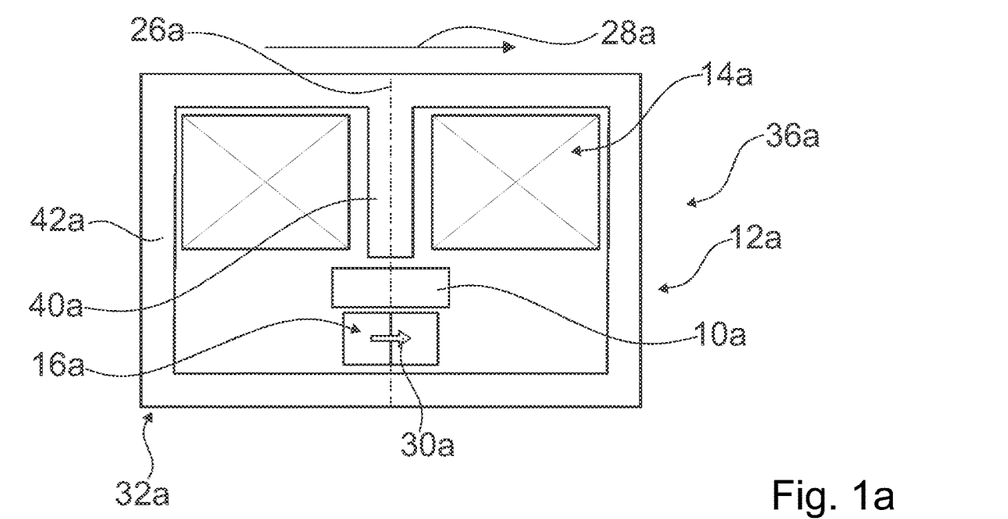
FIGS. 1a-b show an actuator having an actuator device in a schematic side view.
Figure 1B:
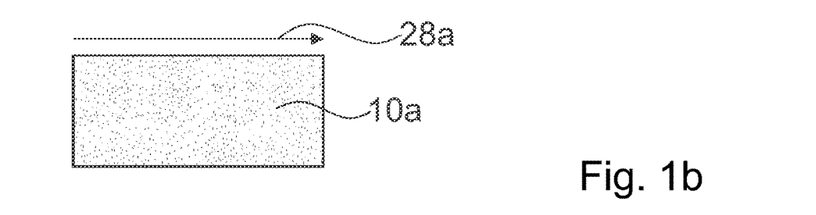

FIGS. 1a and 1b show an exemplary actuator 36a having an actuator device in a schematic view. The actuator device comprises at least one actuator element 10a (cf. also FIG. 1b). The actuator device in the present case comprises exactly one actuator element 10a. In principle, an actuator device could however also have another number of actuator elements such as, for example, at least two actuator elements and/or at least three actuator elements.

The actuator element 10a is implemented so as to be integral. The actuator element 10a is implemented as a solid body. The actuator element 10a is implemented so as to be at least substantially stripe-shaped and/or cuboid. The actuator element 10a is implemented so as to be elongate and has a longitudinal extent that in particular in FIGS. 1a and 1b is arranged so as to be horizontal. The longitudinal extent of the actuator element 10a herein defines a direction of longitudinal extent 28a of the actuator element 10a. A longitudinal extent of the actuator element 10a is preferably at least 5 mm, advantageously at least 7.5 mm, and particularly preferably at least 10 mm, and/or at most 60 mm, advantageously at most 40 mm, and particularly preferably at most 20 mm. A transverse extent of the actuator element 10a that in particular in FIGS. 1a and 1b is arranged so as to be vertical is preferably at least 0.5 mm, advantageously at least 1 mm, and particularly preferably at least 2 mm, and/or at most 20 mm, advantageously at most 10 mm, and particularly preferably at most 5 mm. A height extent of the actuator element 10a is furthermore preferably at most 1 mm.

Moreover, the actuator element 10a is implemented so as to be shape-shiftable. The actuator element 10a is composed of a magnetically shape-shiftable material. The actuator element 10a is composed of a magnetically shape-shiftable shape-memory material. The actuator element 10a in the present case is composed of a magnetic shape-memory alloy. The magnetic shape-memory alloy contains nickel, manganese, and gallium. The actuator element 10a herein is composed of a nickel/manganese/gallium alloy. The actuator element 10a is furthermore implemented as a mono-crystal. Alternatively, an actuator element could however also be composed of a nickel/manganese/gallium-containing alloy, an iron/palladium alloy, and/or an iron/palladium-containing alloy. Moreover, an actuator element could also be implemented as a foam, a poly-crystal, and/or as a composite structure, wherein in the latter case component parts of nickel, manganese, and gallium could be embedded in a matrix. In principle, an actuator element could furthermore also be composed of a magnetostrictive material.

The magnetically shape-shiftable shape-memory material used is a magnetically active material. This material has the property that a deformation and/or a shape alteration of the actuator element 10a, in the present case in at least one operating state a local deformation in the direction of the transverse extent of the actuator element 10a and correlated thereto an expansion movement in the direction of longitudinal extent 28a of the actuator element 10a, takes place as a reaction to a magnetic field such as applied by a magnetic element that is implemented as a coil and/or a permanent magnet, for example, having a defined minimum field strength and a defined direction. In the present case, the actuator element 10a is thus capable of being influenced and in particular deformed by means of a magnetic field.

The actuator device furthermore comprises a magnetic unit 12a. The magnetic unit 12a is arranged in a proximity of the actuator element 10a. The magnetic unit 12a is immobile relative to the actuator element 10a. The magnetic unit 12a is configured to provide a magnetic field that acts on the actuator element 10a. The magnetic unit 12a is configured to provide a magnetic field which is aligned so as to be at least substantially perpendicular to the direction of longitudinal extent 28a of the actuator element 10a. The magnetic unit 12a is configured to provide a variable magnetic field. The magnetic unit 12a is configured for influencing a deformation of the actuator element 10a, in particular by means of the magnetic field.

To this end, the magnetic unit 12a comprises at least two magnetic elements 14a, 16a. The magnetic unit 12a in the present case comprises exactly two magnetic elements 14a, 16a. The magnetic elements 14a, 16a are implemented in a mutually separate manner. The magnetic elements 14a, 16a are differently implemented. The magnetic elements 14a, 16a are arranged on different sides of the actuator element 10a. The magnetic elements 14a, 16a herein are arranged on opposite sides of the actuator element 10a. The magnetic elements 14a, 16a in the present case are arranged on opposite longitudinal sides of the actuator element 10a.

A first magnetic element 14a of the magnetic elements 14a, 16a is implemented as a coil unit. The first magnetic element 14a herein is implemented as a single coil, in particular as an electromagnet. The first magnetic element 14a is actively actuatable and has an operative connection to supply electronics (not illustrated) of the actuator device. The first magnetic element 14a is immobile relative to the actuator element 10a. The first magnetic element 14a is arranged in a proximity of the actuator element 10a. The first magnetic element 14a is arranged spaced apart from the actuator element 10a. The first magnetic element 14a is arranged in such a manner that magnetic field lines generated by means of the first magnetic element 14a intersect and/or penetrate the actuator element 10a at least substantially perpendicularly in relation to the longitudinal extent of the actuator element 10a. The first magnetic element 14a herein has a coil axis 26a which is aligned so as to be perpendicular to the direction of the longitudinal extent 28a of the actuator element 10a.

A second magnetic element 16a of the magnetic elements 14a, 16a is implemented as a permanent magnet. The magnetic unit 12a in the present case accordingly comprises at most two magnetic elements that are implemented as coil units. The second magnetic element 16a is implemented so as to be integral. The second magnetic element 16a is implemented so as to be at least substantially cuboid.

Moreover, the second magnetic element 16a is implemented so as to be passive and is in particular free of any active actuation possibility. The second magnetic element 16a is composed of a permanently magnetic material. The permanently magnetic material is a hard magnetic material which in particular has a coercive field strength of at least 1 kA/m and advantageously at least 50 kA/m. The second magnetic element 16a herein is implemented as a rare-earth magnet and in particular after an initial magnetization has a residual magnetism. A residual magnetism flux density of the second magnetic element 16a is advantageously at least 0.4 T. The second magnetic element 16a in the present case is in particular composed of neodymium/iron/boron.

The second magnetic element 16a is immobile relative to the actuator element 10a. The second magnetic element 16a is arranged in a proximity of the actuator element 10a. The second magnetic element 16a is arranged spaced apart from the actuator element 10a. The second magnetic element 16a is furthermore implemented so as to be elongate and has a longitudinal extent that in particular in FIGS. 1a and 1b is arranged so as to be horizontal. The second magnetic element 16a herein has a longitudinal extent which is aligned so as to be parallel with the direction of longitudinal extent 28a of the actuator element 10a. The second magnetic element 16a moreover has a magnetizing direction 30a which is aligned so as to be parallel with the direction of longitudinal extent 28a of the actuator element 10a. The second magnetic element 16a is arranged in such a manner that magnetic field lines of the second magnetic element 16a intersect and/or penetrate the actuator element 10a at least substantially parallel in relation to the longitudinal extent of the actuator element 10a.

The first magnetic element 14a and the second magnetic element 16a are arranged in such a manner that said first magnetic element 14a and said second magnetic element 16a interact. The first magnetic element 14a and the second magnetic element 16a herein are arranged in such a manner that individual magnetic fields of the first magnetic element 14a and of the second magnetic element 16a are mutually superimposed and generate a common and/or resulting magnetic field in particular in a region of the actuator element 10a. In principle, however, a magnetic unit could also have another number of, in particular interacting, magnetic elements such as, for example, three magnetic elements and/or four magnetic elements. Moreover, a magnetic element that is implemented as a coil unit and/or magnetic element that is implemented as a permanent magnet could in principle also be mounted so as to be movable relative to an actuator element.

The magnetic unit 12a moreover comprises at least one flux direction means 32a. The magnetic unit 12a in the present case comprises exactly one flux direction means 32a. The flux direction means 32a is implemented so as to be integral. The flux direction means 32a is implemented as a ferrite element, in the present case in particular as an iron element. The flux direction means 32a conjointly with the second magnetic element 16a forms a magnetic circuit.

The flux direction means 32a has a first flux direction means portion 40a. The first flux direction means portion 40a corresponds to a magnetic core, in particular of the first magnetic element 14a. The first flux direction means portion 40a has a longitudinal extent which is aligned so as to be parallel with the coil axis 26a. The first flux direction means portion 40a herein is arranged in a central region of the first magnetic element 14a. The flux direction means 32a furthermore comprises a second flux direction means portion 42a. The second flux direction means portion 42a corresponds to a magnetic back iron, in the present case in particular to a closed magnetic back iron. The second flux direction means portion 42a completely encompasses the actuator element 10a. The second flux direction means portion 42a furthermore completely encompasses the first magnetic element 14a. Moreover, the second flux direction means portion 42a completely encompasses the second magnetic element 16a.

The flux direction means 32a is configured for at least partially directing and/or guiding magnetic field lines of the magnetic unit 12a, in particular of the first magnetic element 14a and of the second magnetic element 16a, in particular so as to achieve a defined deformation of the actuator element 10a. Alternatively, a flux direction means could also be embodied in a multi-part implementation. In principle, it is moreover also conceivable for a first flux direction means portion and/or a second flux direction means portion to be dispensed with. Moreover, it is conceivable for a flux direction means, in particular a first flux direction means portion and/or a second flux direction means portion, to be provided with at least one gap, advantageously an air gap.

A functional mode of the actuator device will now be explained hereunder with reference to FIGS. 2a to 3b.

The magnetic unit 12a in the present case by means of a magnetic field is configured for causing an in particular purely local deformation 18a, 20a of the actuator element 10a in a first partial region 22a of the actuator element 10a and in a second partial region 24a of the actuator element 10a that is different from the first partial region 22a.

The partial regions 22a, 24a herein are in each case partial regions of a longitudinal side, in the present case in particular of the same longitudinal side, of the actuator element 10a. The first partial region 22a furthermore corresponds to a first peripheral region of the actuator element 10a which extends in particular across at most 50% of an entire longitudinal extent of the actuator element 10a. The second partial region 24a corresponds to a second peripheral region of the actuator element 10a which extends in particular across at most 50% of an entire longitudinal extent of the actuator element 10a. The second partial region 24a herein is opposite the first partial region 22a, in particular in relation to the direction of longitudinal extent 28a of the actuator element 10a.

In the present case, the first magnetic element 14a and the second magnetic element 16a are configured for interacting in at least one first operating state so as to cause a local deformation 18a of the actuator element 10a in the first partial region 22a of the actuator element 10a.

Figure 2A:
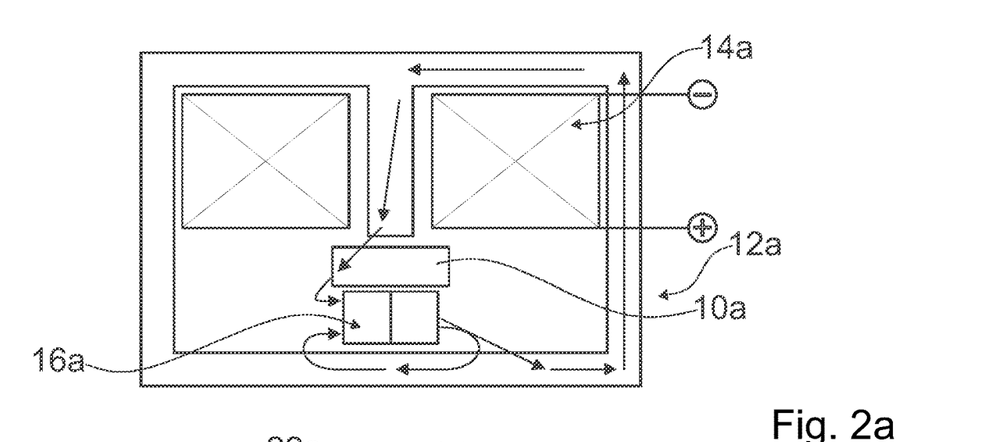
FIGS. 2a-b show the actuator having the actuator device in a first operating state.
Figure 2B:
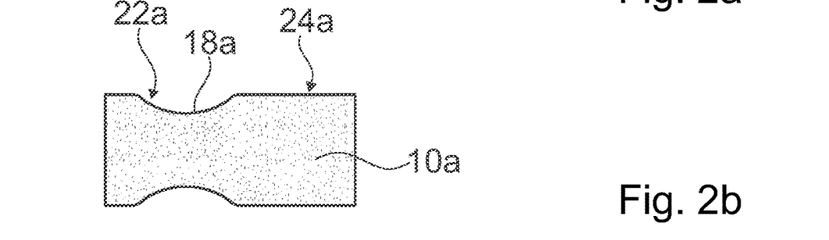

FIGS. 2a and 2b show the actuator device in the first operating state. FIG. 2a herein shows in particular a profile of magnetic field lines of the magnetic unit 12a, while a deformation of the actuator element 10a is illustrated in FIG. 2b. The first magnetic element 14a in the first operating state by means of the supply electronics is impinged with a current on account of which, in particular conjointly with the second magnetic element 16a, a common first magnetic field is caused. As a result, the actuator element 10a is locally deformed in the first partial region 22a. Moreover, the actuator element 10a is not deformed a partial region that is different from the first partial region 22a, and in particular in the second partial region 24a. The local deformation 18a in the first partial region 22a herein corresponds to a local depression and/or trough. The local deformation 18a in the first partial region 22a has an at least substantially semi-elliptic contour. The local deformation 18a in the first partial region 22a has a longitudinal extent that is arranged so as to be in particular parallel with the direction of longitudinal extent 28a of the actuator element 10a.

Moreover, the first magnetic element 14a and the second magnetic element 16a are configured for interacting in at least one second operating state so as to cause a local deformation 20a of the actuator element 10a in the second partial region 24a of the actuator element 10a.

Figure 3A:
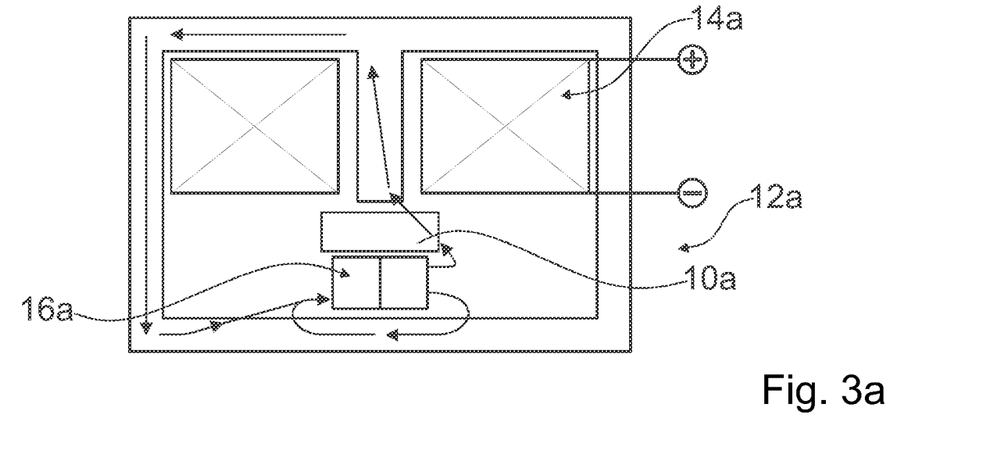
FIGS. 3a-b show the actuator having the actuator device in a second operating state.
Figure 3B:
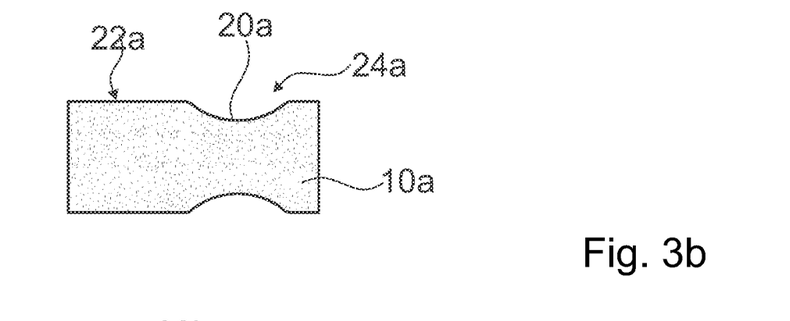

FIGS. 3a and 3b show the actuator device in the second operating state. FIG. 3a herein shows in particular a profile of magnetic field lines of the magnetic unit 12a, while a deformation of the actuator element 10a is illustrated in FIG. 3b. The first magnetic element 14a in the second operating state by means of the supply electronics is impinged with a current, in particular counter current, that is counter to the current, on account of which in particular conjointly with the second magnetic element 16a a common second magnetic field is caused. As a result, the actuator element 10a is locally deformed in the second partial region 24a. Moreover, the actuator element 10a is not deformed in a partial region that is different from the second partial region 24a, and in particular in the first partial region 22a. The local deformation 20a in the second partial region 24a herein corresponds to a local depression and/or trough. The local deformation 20a in the second partial region 24a has an at least substantially semi-elliptic contour. The local deformation 20a in the second partial region 24a has a longitudinal extent that is arranged so as to be in particular parallel with the direction of longitudinal extent 28a of the actuator element 10a. The local deformation 20a in the second partial region 24a corresponds at least substantially to the local deformation 18a in the first partial region 22a. In principle, a deformation of the actuator element in at least one partial region could also correspond to a local elevation. Moreover, it is also conceivable that a magnetic unit can be configured only for generating a local deformation in exactly one partial region of an actuator element. A magnetic unit could also be configured for generating a local deformation in at least three and/or at least four partial regions of an actuator element.

Moreover, the first magnetic element 14a and the second magnetic element 16a in the present case are configured, in particular by means of a corresponding alternating actuation of the first magnetic element 14a, in particular by means of the supply electronics, to generate a variable magnetic field so as to cause a movement of the local deformation 18a, 20a from the first partial region 22a to the second partial region 24a. The first magnetic element 14a and the second magnetic element 16a herein are configured for generating an at least substantially uniform movement of the local deformation 18a, 20a from the first partial region 22a to the second partial region 24a, on account of which an advantageous pump movement and/or a variably adjustable movement can be achieved, for example. The supply electronics in this case are configured to provide a current having a rectangular and/or advantageously sinusoidal profile for generating the alterable magnetic field.

Further exemplary embodiments of the invention are shown in FIGS. 4 to 11. The following descriptions and the drawings are substantially limited to the points of differentiation between the exemplary embodiments, wherein reference can be made in principle also to the drawings and/or of the description of the other exemplary embodiments, in particular of FIGS. 1 to 3b in terms of identically identified components, in particular with reference to components having the same reference signs. In order for the exemplary embodiments to be differentiated, the reference signs of the exemplary embodiment in FIGS. 1 to 3b are suffixed with the letter a. The letter a is replaced by the letters b to e in the exemplary embodiments of FIGS. 4 to 11.

Figure 4:
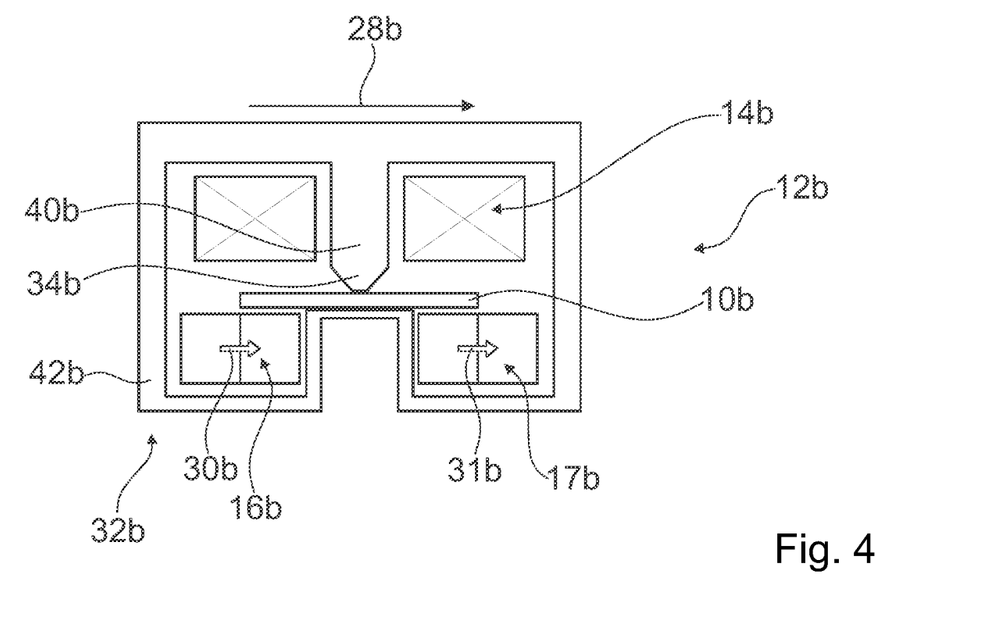
FIG. 4 shows a further actuator having a further actuator device in a schematic side view.

A further exemplary embodiment of the invention is shown in FIG. 4. The exemplary embodiment of FIG. 4 is suffixed with the letter b. The further exemplary embodiment of FIG. 4 differs from the preceding exemplary embodiment at least substantially in terms of a design embodiment of a magnetic unit 12b.

The magnetic unit 12b in the present case comprises three magnetic elements 14b, 16b, 17b which are configured for interacting so as to cause a local deformation 18b, 20b of an actuator element 10b. The magnetic elements 14b, 16b, 17b herein are configured for interacting in at least one first operating state so as to cause a local deformation 18b of the actuator element 10b in a first partial region 22b of the actuator element 10a. Moreover, the magnetic elements 14b, 16b, 17b are configured for interacting in at least one second operating state so as to cause a local deformation 20b of the actuator element 10b in a second partial region 24b of the actuator element 10a. Moreover, the magnetic elements 14b, 16b, 17b can be configured for generating an alterable magnetic field so as to cause a movement of the local deformation 18b, 20b from the first partial region 22b to the second partial region 24b.

A first magnetic element 14b of the magnetic elements 14b, 16b, 17b herein corresponds at least substantially to a first magnetic element 14a of the preceding exemplary embodiment.

A second magnetic element 16b and a third magnetic element 17b of the magnetic elements 14b, 16b, 17b are in each case implemented as a permanent magnet. The second magnetic element 16b and the third magnetic element 17b are implemented so as to be mutually separate. The second magnetic element 16b and the third magnetic element 17b are implemented so as to be at least substantially mutually identical. The second magnetic element 16b and the third magnetic element 17b are in each case implemented so as to be integral. The second magnetic element 16b and the third magnetic element 17b are in each case implemented so as to be at least substantially cuboid.

Moreover, the second magnetic element 16b and the third magnetic element 17b are implemented so as to be passive and in particular so as to be free from any active actuation possibility. The second magnetic element 16b and the third magnetic element 17b are in each case composed of a permanently magnetic material. In the present case, the second magnetic element 16b and the third magnetic element 17b are composed of the same permanently magnetic material. The permanently magnetic material is a hard magnetic material which in particular has a coercive field strength of at least 1 kA/m and advantageously at least 50 kA/m. The second magnetic element 16b and the third magnetic element 17b herein are in each case implemented as a rare-earth magnet and in particular after initial magnetizing have a residual magnetism. A residual magnetic flux density is advantageously at least 0.4 T.

The second magnetic element 16b and the third magnetic element 17b are in each case immobile relative to the actuator element 10b. The second magnetic element 16b and the third magnetic element 17b are in each case arranged in a proximity of the actuator element 10b. The second magnetic element 16b and the third magnetic element 17b are arranged on a same side of the actuator element 10b. The second magnetic element 16b and the third magnetic element 17b are in each case arranged spaced apart from the actuator element 10b. A spacing between the second magnetic element 16b and the actuator element 10b herein is identical to a spacing between the third magnetic element 17b and the actuator element 10b. Moreover, the second magnetic element 16b and the third magnetic element 17b are mutually spaced apart. The second magnetic element 16b and the third magnetic element 17b are mutually offset in the longitudinal extent of the actuator element 10b.

The second magnetic element 16b and the third magnetic element 17b are furthermore in each case implemented so as to be elongate and have a longitudinal extent that in particular in FIG. 4 is arranged so as to be horizontal. The second magnetic element 16b and the third magnetic element 17b herein have in each case a longitudinal extent which is aligned so as to be parallel with a direction of longitudinal extent 28b of the actuator element 10b. Moreover, the second magnetic element 16b and the third magnetic element 17b have in each case a magnetizing direction 30b, 31b which is aligned so as to be parallel with the direction of longitudinal extent 28b of the actuator element 10b. Furthermore, a magnetizing direction 30b of the second magnetic element 16b is identical to a further magnetizing direction 31b of the third magnetic element 17b. The second magnetic element 16b and the third magnetic element 17b herein are arranged in such a manner that magnetic field lines of the second magnetic element 16b and of the third magnetic element 17b intersect and/or penetrate the actuator element 10b at least substantially parallel in relation to the longitudinal extent of the actuator element 10b.

The first magnetic element 14b, the second magnetic element 16b, and the third magnetic element 17b are arranged in such a manner that individual magnetic fields of the magnetic elements 14b, 16b, 17b are mutually superimposed and generate a common and/or resulting magnetic field in particular in a region of the actuator element 10b. Alternatively, it is conceivable for a second magnetic element and a third magnetic element to be implemented dissimilarly and/or to be arranged in a different configuration.

Moreover, the magnetic unit 12b comprises at least one flux concentrator 34b. The magnetic unit 12b in the present case comprises exactly one flux concentrator 34b. The flux concentrator 34b has an at least substantially conical shape and/or contour. The flux concentrator 34b is implemented as a ferrite element, in the present case in particular as an iron element. The flux concentrator 34b is part of a flux direction means 32b of the magnetic unit 12b. The flux concentrator 34b herein is implemented so as to be integral to the flux direction means 32b. The flux concentrator 34b in the present case is implemented so as to be integral to a first flux direction means portion 40b of the flux direction means 32b. The flux concentrator 34b is arranged on a side of the first flux direction means portion 40b that faces the actuator element 10b. The flux concentrator 34b is assigned to the first magnetic element 14b. The flux concentrator 34b in an assembled state is arranged between the first magnetic element 14b and the actuator element 10b. The flux concentrator 34b is configured for increasing a magnetic field, in particular of the first magnetic element 14b, that acts on the actuator element 10b. Alternatively, a magnetic unit could also have another number of flux concentrators such as, for example, at least two and/or at least four flux concentrators, which can in particular be arranged on different sides of an actuator element. It is moreover conceivable for flux concentrators to be implemented so as to be separate from a flux direction means.

FIGS. 5a to 7b show a further exemplary embodiment of the invention. The exemplary embodiment of FIGS. 5a to 7b is suffixed with the letter c. The further exemplary embodiment of FIGS. 5a to 7b differs from the preceding exemplary embodiments at least substantially in terms of an alignment of a second magnetic element 16c of a magnetic unit 12c.

The second magnetic element 16c is implemented so as to be elongate and has a longitudinal extent that in particular in FIGS. 5a to 7b is arranged so as to be vertical. The second magnetic element 16c herein has a longitudinal extent which is aligned so as to be perpendicular to a direction of longitudinal extent 28c of an actuator element 10c. Moreover, the second magnetic element 16c has a magnetizing direction 30c which is aligned so as to be perpendicular to the direction of longitudinal extent 28c of the actuator element 10c. The second magnetic element 16c is arranged in such a manner that magnetic field lines of the second magnetic element 16c intersect and/or penetrate the actuator element 10c at least substantially perpendicularly in relation to the longitudinal extent of the actuator element 10c. Apart therefrom, the second magnetic element 16c corresponds to the second magnetic element 16a of the first exemplary embodiment.

Figure 5A:
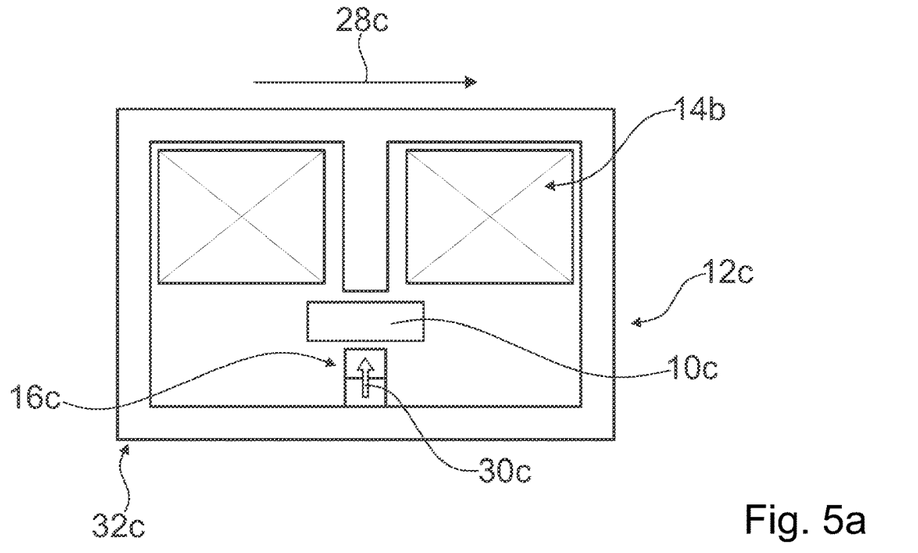
FIGS. 5a-b show a further actuator having a further actuator device in a schematic side view.
Figure 5B:
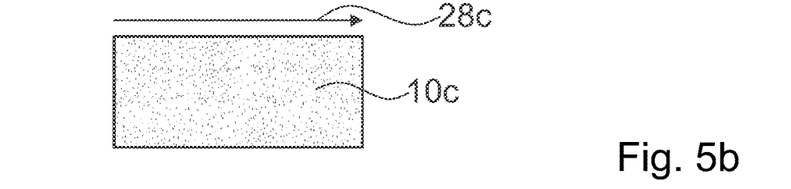

The magnetic unit 12c by virtue of the disposal of the second magnetic element 16c by means of a magnetic field is configured for causing an in particular purely local deformation 18c, 20c, 21c of the actuator element 10c in three different partial regions 22c, 24c, 25c of the actuator element 10c, in particular in a first partial region 22c of the actuator element 10c, in a second partial region 24c of the actuator element 10c that is different from the first partial region 22c, and in a third partial region 25c of the actuator element 10c that is different from the first partial region 22c and from the second partial region 24c.

The first partial region 22c herein corresponds to a central region of the actuator element 10c. The second partial region 24c corresponds to a first peripheral region of the actuator element 10c. The third partial region 25c corresponds to a second peripheral region of the actuator element 10c. The third partial region 25c herein is opposite the second partial region 24c, in particular in relation to the direction of longitudinal extent 28c of the actuator element 10c.

Figure 6A:
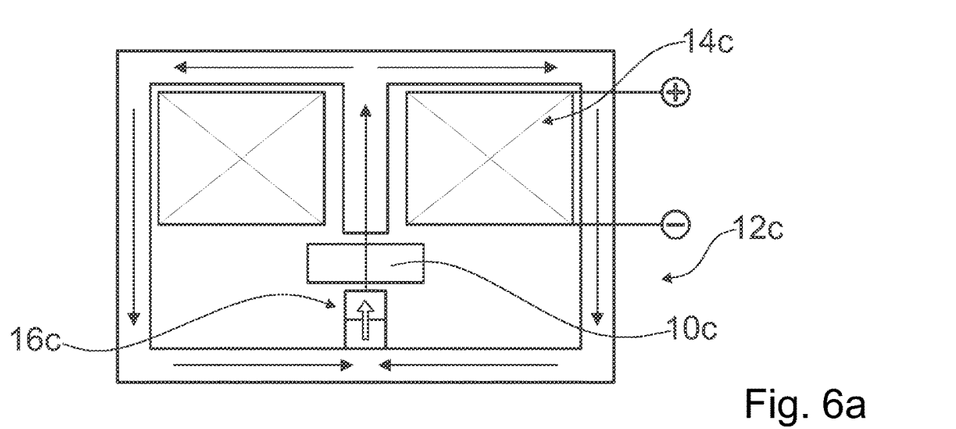
FIGS. 6a-b show the further actuator having the further actuator device from FIGS. 5a-b in a first operating state.
Figure 6B:
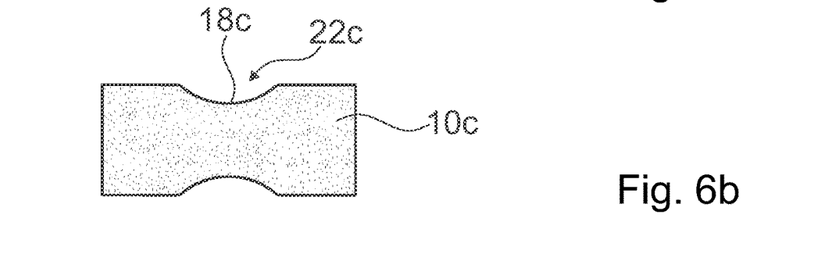

In the present case, a first magnetic element 14c and the second magnetic element 16c are configured for interacting in at least one first operating state so as to cause a local deformation 18c of the actuator element 10c in the first partial region 22c of the actuator element 10c (cf. in particular FIGS. 6a and 6b).

Figure 7A:
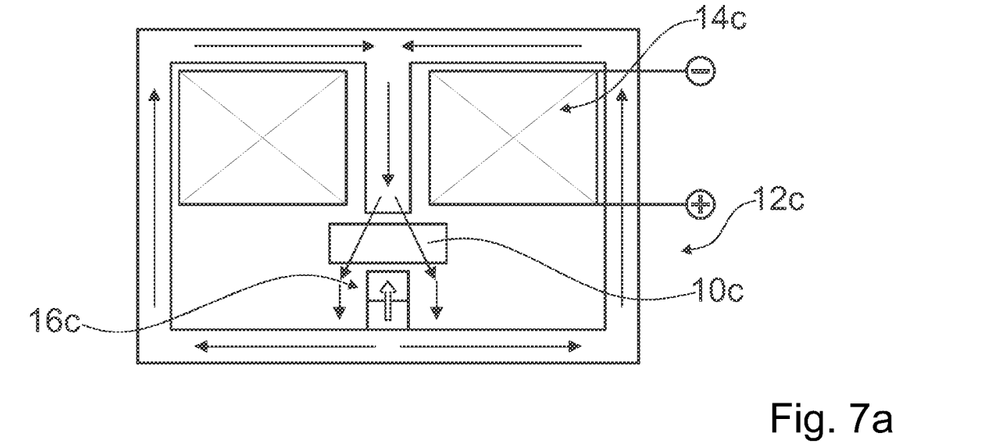
FIGS. 7a-b show the further actuator having the further actuator device from FIGS. 5a-b in a second operating state.
Figure 7B:
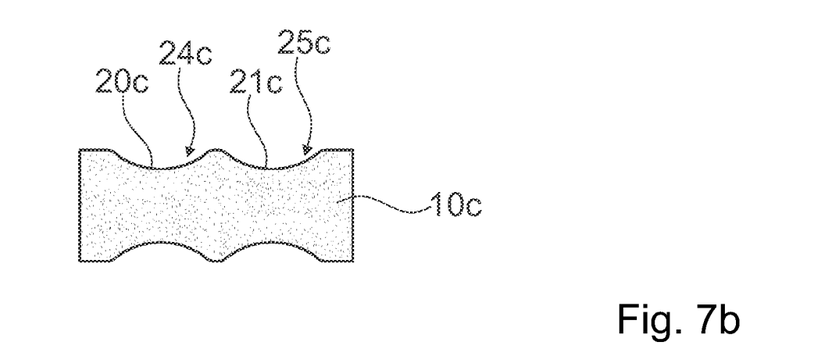

Moreover, the first magnetic element 14c and the second magnetic element 16c are configured for interacting in at least one second operating state so as to cause a local deformation 20c of the actuator element 10c in the second partial region 24c of the actuator element 10c and, in particularly simultaneously, a local deformation 21c of the actuator element 10c in the third partial region 25c of the actuator element 10c (cf. in particular FIGS. 7a and 7b).

Moreover, the magnetic elements 14c, 16c, in particular the first magnetic element 14c and the second magnetic element 16c, can be configured for generating a variable magnetic field so as to cause an in particular simultaneous movement of the local deformation 18c, 20c, 21c from the first partial region 22c to the second partial region 24c and to the third partial region 25c. Alternatively or additionally, the magnetic elements 14c, 16c, in particular the first magnetic element 14c and the second magnetic element 16c, can be configured for generating a variable magnetic field so as to cause an in particular simultaneous movement of the local deformation 18c, 20c, 21c from the second partial region 24c and from the third partial region 25c to the first partial region 22c.

Figure 8:
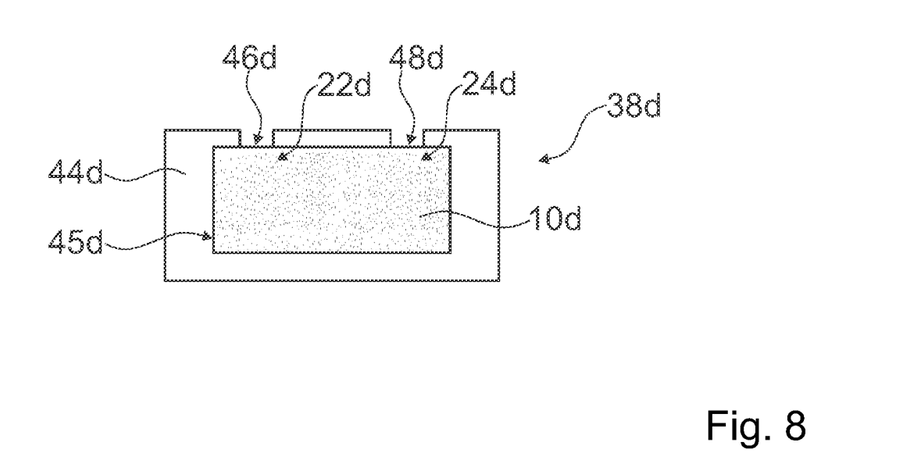
FIG. 8 shows a fluid pump having a further actuator device in a schematic side view.
Figure 9:
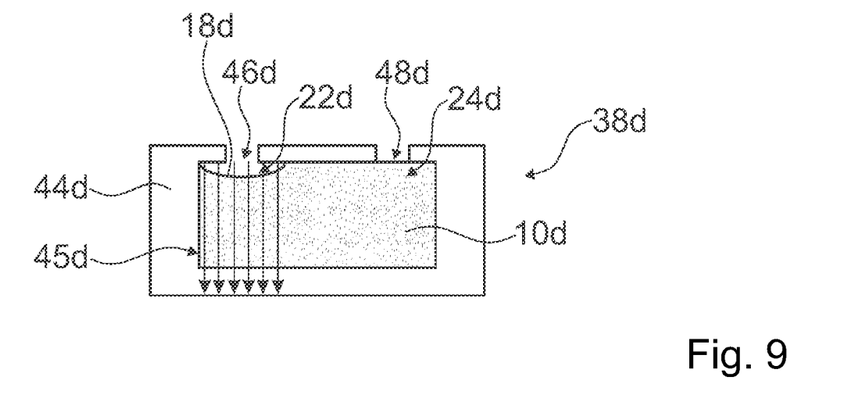
FIG. 9 shows the fluid pump having the further actuator device from FIG. 8 in a first operating state.
Figure 10:
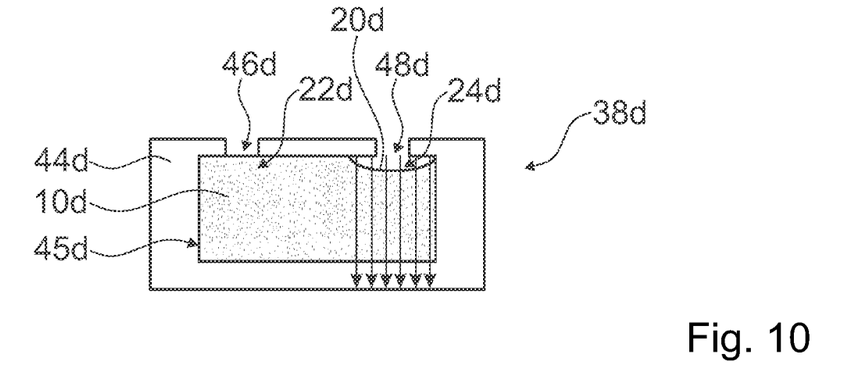
FIG. 10 shows the fluid pump having the further actuator device from FIG. 8 in a second operating state.

A further exemplary embodiment of the invention is shown in FIGS. 8 to 10. The exemplary embodiment of FIGS. 8 to 10 is suffixed with the letter d. The further exemplary embodiment of FIGS. 8 to 10 shows an exemplary application of an actuator device according to the preceding exemplary embodiments.

FIGS. 8 to 10 show a fluid pump 38d which in an exemplary manner is implemented as a micro pump. The fluid pump 38d in the present case is configured for use in the automotive sector, for example as a metering pump for fuel, and/or in the medical sector, for example for dedicating medicinal active substances.

The fluid pump 38d comprises an actuator device according to the invention having an actuator element 10d wherein the illustration of a magnetic unit has been dispensed with for the sake of clarity.

Moreover, the fluid pump 38d comprises a fluid receptacle unit 44d. The fluid receptacle unit 44d is implemented as an encapsulation unit. The fluid receptacle unit 44d is implemented so as to be at least substantially cuboid. The fluid receptacle unit 44d has a longitudinal extent that corresponds to a longitudinal extent of the actuator element 10d. The fluid receptacle unit 44d is at least to a large part composed of silicone. The fluid receptacle unit 44d defines a receptacle space 45d for the actuator element 10d that is adapted to the actuator element 10d.

The fluid receptacle unit 44d furthermore has an inlet opening 46d and an outlet opening 48d. The inlet opening 46d is configured for charging a fluid, said fluid in the present case being in particular liquid. The inlet opening 46d is arranged in a first peripheral region of the fluid receptacle unit 44d. The outlet opening 48d is configured for discharging the fluid. The outlet opening 48d is arranged in a second peripheral region of the fluid receptacle unit 44d that is opposite the first peripheral region. The inlet opening 46d and the outlet opening 48d in the present case are arranged on a same side of the fluid receptacle unit 44d.

The actuator element 10d in an operating state is arranged in the receptacle space 45d at least in a form-fitting manner, in particular in such a manner that the inlet opening 46d and the outlet opening 48d are arranged in different further peripheral regions of a longitudinal side of the actuator element 10d. The inlet opening 46d herein is assigned to a first partial region 22d of the actuator element 10d. The outlet opening 48d is assigned to a second partial region 24d of the actuator element 10d. The actuator element 10d closes a fluid line which connects the inlet opening 46d to the outlet opening 48d. Moreover, the actuator element 10d is connected in a materially integral manner to the fluid receptacle unit 44d. At least one longitudinal side of the actuator element 10d herein is connected in materially integral manner to the fluid receptacle unit 44d. In the present case, a longitudinal side of the actuator element 10d that is opposite the inlet opening 46d and/or opposite the outlet opening 48d is connected in a materially integral manner to the fluid receptacle unit 44d. Alternatively, a fluid receptacle unit could also be composed of a material that deviates from silicone such as, for example plastics material and/or aluminum. It is moreover conceivable for an inlet opening and/or an outlet opening to be arranged on different end sides of an actuator element. Moreover, in principle a materially integral connection between an actuator element and a fluid receptacle unit could also be dispensed with.

Magnetic elements of the magnetic unit in the present case are configured for interacting in at least one first operating state so as to cause a local deformation 18d of the actuator element 10d in the first partial region 22d of the actuator element 10d, said first partial region 22d being in particular assigned to the inlet opening 46d (cf. in particular FIG. 9).

The magnetic elements are furthermore configured for interacting in at least one second operating state so as to cause a local deformation 20d of the actuator element 10d in the second partial region 24d of the actuator element 10d, said second partial region 24d being in particular assigned to the outlet opening 48d (cf. in particular FIG. 10).

Moreover, the magnetic elements are configured for generating a variable magnetic field so as to cause an in particular uniform movement of the local deformation 18d, 20d from the first partial region 22d to the second partial region 24d. On account thereof, an advantageous pump movement can be achieved, and the fluid can in particular be conveyed from the inlet opening 46d to the outlet opening 48d. Moreover, the fluid pump 38d in this case could also comprise at least one additional valve, advantageously a non-return valve, in particular in the region of the inlet opening 46d, on account of which it can advantageously be ensured that the fluid is not conveyed back into a supply connector that is connected to the inlet opening 46d. However, a non-return valve can preferably be entirely dispensed with.

Alternatively or additionally, the magnetic elements can also be configured for generating a variable magnetic field so as to cause an in particular uniform movement of the local deformation 18d, 20d from the second partial region 24d to the first partial region 22d, on account of which an advantageous reversibility can in particular be achieved.

Figure 11:
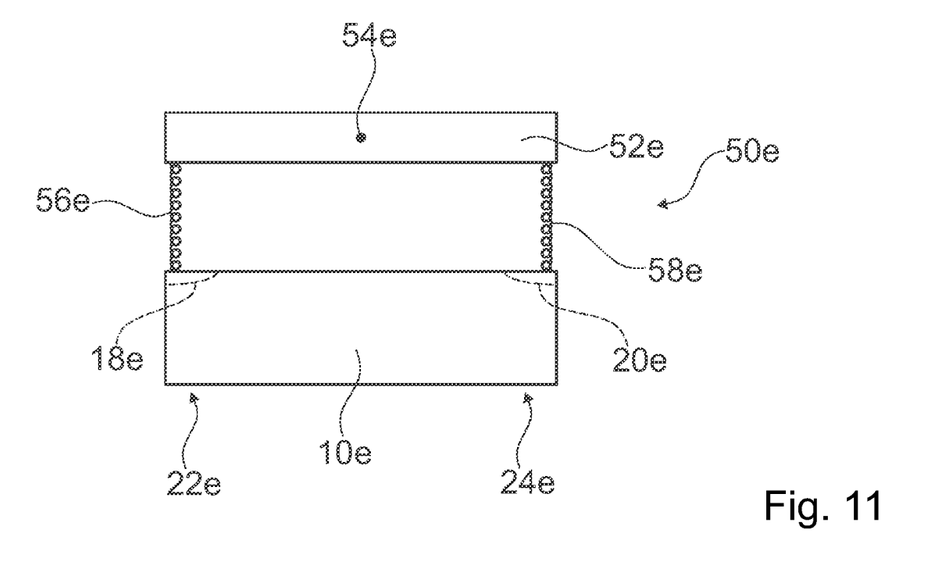
FIG. 11 shows a positioning system having at least one further actuator device in a schematic side view.

A further exemplary embodiment of the invention is shown in FIG. 11. The exemplary embodiment of FIG. 11 is suffixed with the letter e. The further exemplary embodiment of FIG. 11 shows a further exemplary application of an actuator device corresponding to the preceding exemplary embodiments.

FIG. 11 shows a positioning system 50e that in an exemplary manner is implemented as an optical positioning system. The positioning system 50e in the present case serves for positioning at least one optical construction element 52e.

The optical construction element 52e in an exemplary manner is embodied as a mirror and mounted so as to be movable about a bearing axis 54e.

The positioning system 50e for positioning the optical construction element 52e comprises an actuator device according to the invention having an actuator element 10e, wherein the illustration of a magnetic unit has been dispensed with for the sake of clarity.

The actuator element 10e has an operative connection to the optical construction element 52e. To this end, the actuator device comprises at least one movement transmission element 56e, 58e. The actuator device in the present case comprises two movement transmission elements 56e, 58e. The movement transmission elements 56e, 58e are at least substantially mutually identical. The movement transmission elements 56e, 58e are in each case embodied as an elastic element. The movement transmission elements 56e, 58e in the present case are in each case embodied as an elastic spring element, in the present case in particular as a compression spring.

The movement transmission elements 56e, 58e have in each case a contact connection to the optical construction element 52e, in particular to opposite peripheral regions of the optical construction element 52e. Moreover, the movement transmission elements 56e, 58e have in each case a contact connection to the actuator element 10e. A first movement transmission element 56e of the movement transmission elements 56e, 58e herein is assigned to a first partial region 22e of the actuator element 10e. A second movement transmission element 58e of the movement transmission elements 56e, 58e is assigned a second partial region 24e of the actuator element 10e.

The movement transmission elements 56e, 58e are in each case configured for causing a movement of the optical construction element 52e in particular about the bearing axis 54e. The movement transmission elements 56e, 58e in the present case are configured for in each case converting a local deformation 18e, 20e of the actuator element 10e to a movement of the optical construction element 52e and to transmit said local deformation 18e, 20e to the optical construction element 52e in particular in such a manner that a pivoted position of the optical construction element 52e about the bearing axis 54e is altered. Alternatively, it is conceivable for at least two optical construction elements to be moved by exactly one actuator element. It is moreover conceivable for a plurality of actuator elements such as, for example, at least three and/or at least four actuator elements, to be used for positioning exactly one optical construction element. It is also conceivable for movement transmission elements to be entirely dispensed with and/or for movement transmission elements to be implemented so as to be integral to an actuator element and/or to an optical construction element. In this case, movement transmission elements could in particular also be designed so as to be dimensionally stable. Moreover, an actuator element could be used for a linear positioning of an optical construction element.

The invention claimed is:

1. An actuator device having at least one actuator element which at least in part is composed of a magnetically shape-shiftable material, and having a magnet unit which comprises at least one first magnetic element that is implemented as a coil unit and at least one second magnetic element that is implemented as a permanent magnet, wherein at least the first magnetic element and the second magnetic element are configured for interacting in at least one operating state so as to cause a local deformation of the actuator element in a partial region of the actuator element, wherein the first magnetic element and the second magnetic element are configured for interacting in at least one further operating state so as to cause a local deformation of the actuator element in a further partial region of the actuator element that at least in part is different from the partial region and wherein the first magnetic element and the second magnetic element are configured for generating a variable magnetic field so as to cause a movement of the local deformation from the partial region to the further partial region.

2. The actuator device as claimed in claim 1, wherein the magnetically shape-shiftable material is a magnetic shape-memory material.

3. The actuator device as claimed in claim 1, wherein the actuator element is implemented as a solid body.

4. The actuator device as claimed in claim 1, wherein the first magnetic element and the second magnetic element are arranged on opposite sides of the actuator element.

5. The actuator device as claimed in in claim 1, wherein the first magnetic element has a coil axis which is aligned so as to be at least substantially perpendicular to a direction of longitudinal extent of the actuator element.

6. The actuator device as claimed in in claim 1, wherein the second magnetic element is embodied as a rare-earth magnet.

7. The actuator device as claimed in claim 1, wherein the second magnetic element is arranged spaced apart from the actuator element.

8. The actuator device as claimed in claim 1, wherein the second magnetic element is immobile relative to the actuator element.

9. The actuator device as claimed in claim 1, wherein the second magnetic element has a magnetizing direction which is aligned so as to be at least substantially parallel with a direction of longitudinal extent of the actuator element.

10. The actuator device as claimed in claim 1, wherein the second magnetic element has a magnetizing direction which is aligned so as to be at least substantially perpendicular to a direction of longitudinal extent of the actuator element.

11. The actuator device as claimed in claim 1, wherein the magnetic unit has at least one third magnetic element which is configured for interacting with the first magnetic element and/or the second magnetic element so as to cause a local deformation of the actuator element.

12. The actuator device as claimed in claim 11, wherein the third magnetic element is embodied as a permanent magnet.

13. The actuator device as claimed in claim 11, wherein the third magnetic element is at least substantially identical to the second magnetic element.

14. The actuator device as claimed in claim 11, wherein the second magnetic element and the third magnetic element are arranged on a same side of the actuator element.

15. The actuator device as claimed in claim 1, wherein the magnetic unit has at least one flux concentrator, which is configured for increasing a magnetic field that acts on the actuator element.

16. The actuator device as claimed in claim 1, wherein the magnetic unit comprises at most two magnetic elements that are embodied as coil units.

17. An actuator having at least one actuator device as claimed in claim 1.

18. A fluid pump, in particular a micro pump, in particular for use in the automotive sector and/or the medical sector, having at least one actuator device as claimed in claim 1.

19. A method with an actuator device, wherein the actuator device has at least one actuator element, which at least in part is composed of a magnetically shape-shiftable material, and has a magnetic unit which comprises at least one first magnetic element that is embodied as a coil unit, and at least one second magnetic element that is embodied as a permanent magnet, wherein the actuator element is locally deformed in a partial region at least by means of an interaction of the first magnetic element and of the second magnetic element, wherein the first magnetic element and the second magnetic element interact in at least one further operating state so as to cause a local deformation of the actuator element in a further partial region of the actuator element that at least in part is different from the partial region and wherein the first magnetic element and the second magnetic element generate a variable magnetic field so as to cause a movement of the local deformation from the partial region to the further partial region.

* * * * *